(12) United States Patent
Cho

(10) Patent No.: US 11,525,273 B2
(45) Date of Patent: Dec. 13, 2022

(54) HOUSE DESIGNING SYSTEM

(71) Applicant: DEAR ARCH CO., LTD., Seoul (KR)

(72) Inventor: Han Moo Cho, Incheon (KR)

(73) Assignee: DEAR ARCH CO., LTD., Seoul (KR)

( * ) Notice: Subject to any disclaimer, the term of this patent is extended or adjusted under 35 U.S.C. 154(b) by 232 days.

(21) Appl. No.: 16/756,117

(22) PCT Filed: Jul. 6, 2018

(86) PCT No.: PCT/KR2018/007686
§ 371 (c)(1),
(2) Date: Apr. 15, 2020

(87) PCT Pub. No.: WO2019/078451
PCT Pub. Date: Apr. 25, 2019

(65) Prior Publication Data
US 2020/0318371 A1 Oct. 8, 2020

(30) Foreign Application Priority Data
Oct. 20, 2017 (KR) ........................ 10-2017-0136654

(51) Int. Cl.
*E04H 1/00* (2006.01)
*G06F 30/13* (2020.01)

(52) U.S. Cl.
CPC ............. *E04H 1/005* (2013.01); *G06F 30/13* (2020.01)

(58) Field of Classification Search
CPC ......... E04H 1/005; G06F 30/13; G06F 30/00; G06F 30/20; E04B 1/34815
USPC .............................................. 703/6
See application file for complete search history.

(56) References Cited

U.S. PATENT DOCUMENTS

2010/0198563 A1* 8/2010 Plewe .................... G06F 30/17
703/1

FOREIGN PATENT DOCUMENTS

| CN | 106971028 A | * 7/2017 | ............. G06F 30/13 |
|---|---|---|---|
| JP | 2002163308 A | 6/2002 | |
| JP | 2006-318112 A | 11/2006 | |
| JP | 2007156891 A | 6/2007 | |
| KR | 1020020019118 A | 3/2002 | |
| KR | 100735676 B1 | 7/2007 | |
| KR | 1020140124942 A | 10/2014 | |
| KR | 1020150076684 A | 7/2015 | |

* cited by examiner

*Primary Examiner* — Cedric Johnson
(74) *Attorney, Agent, or Firm* — Invenstone Patent, LLC

(57) ABSTRACT

The present invention relates to a Tetris house designing system, and the technical problem to solve is to facilitate house design by laymen and enable a simulation for a finally decided house structure. For example, disclosed is a Tetris house designing system comprising: a unit interior space providing part for providing respective unit interior spaces of a house by dividing the unit interior spaces into three-dimensional blocks reflecting the actual areas of certain sizes; a unit interior space selection part for selecting the type and number of the unit interior spaces; a house structure generation part for generating house structure data by combining three-dimensional blocks selected by the house unit interior space selection part; and a virtual reality data providing part for generating and providing virtual reality data on the basis of the house structure data.

6 Claims, 10 Drawing Sheets

\<Bedroom\>

\<Kitchen\>

\<Dining room\>

\<Living room\>

\<Bathroom\>

\<Front door\>

\<Stairs\>

\<Empty space\>

FIG. 2
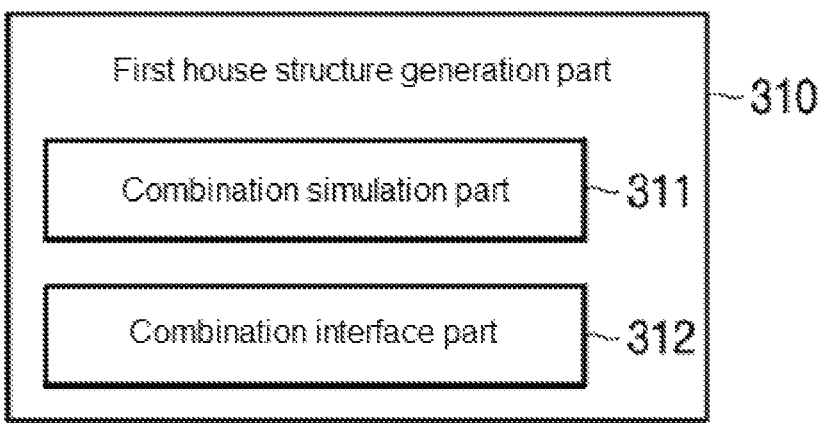
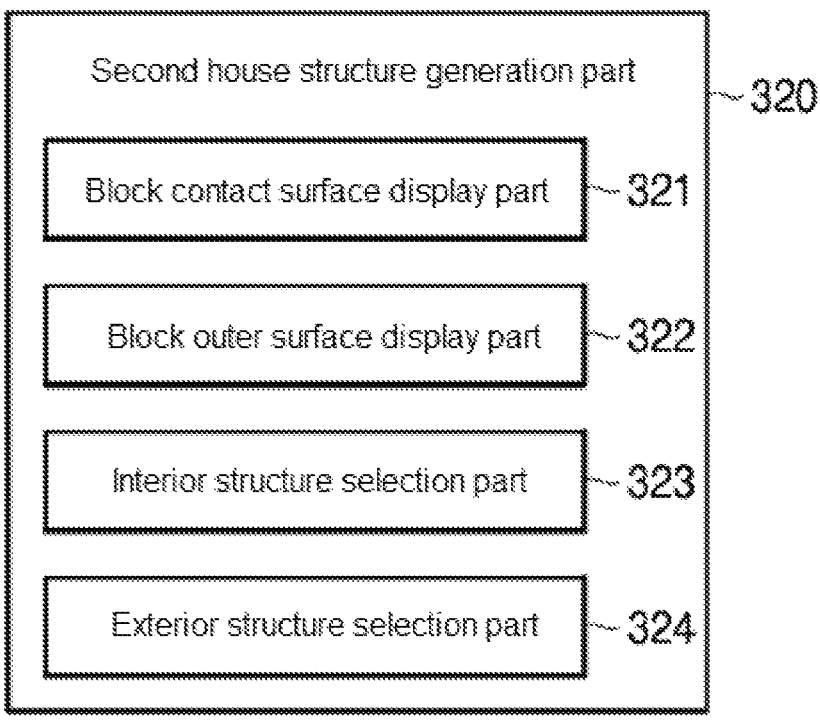

FIG. 5a
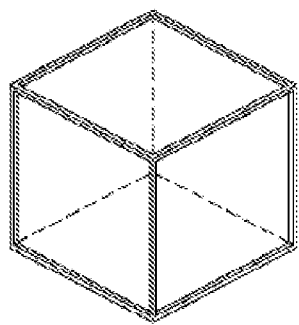
A
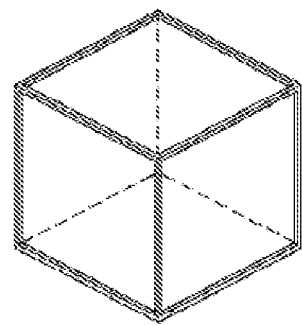
B
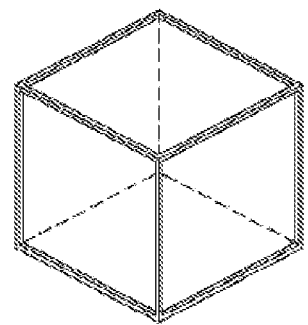
C
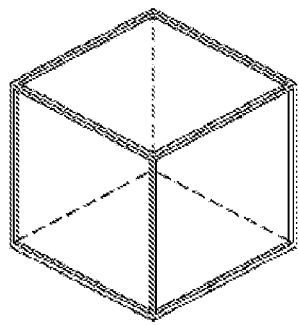
D
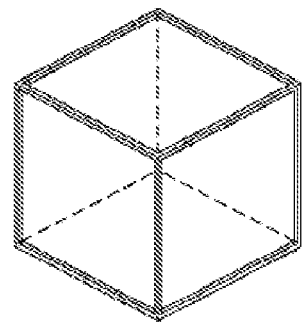
E
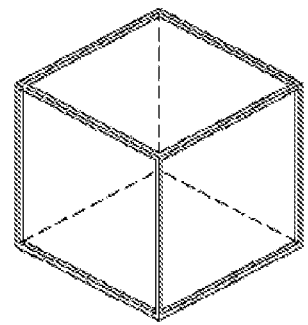
F

HOUSE DESIGNING SYSTEM

CROSS-REFERENCE TO RELATED APPLICATIONS

This application is a National Stage filing under 35 U.S.C. 371 of International Application No. PCT/KR2018/007686, filed Jul. 6, 2018, which claims the benefit of priority to Korean Application(s) No. 10-2017-0136654, filed Oct. 20, 2017 in the Korean Intellectual Property Office, the disclosures of which are incorporated herein by reference.

BACKGROUND OF THE INVENTION

Field of the Invention

The present disclosure relates to a Tetris house designing system.

Related Art

A recent trend in modern houses is to design houses in a way that reflects their unique characteristics without being uniform in structure.

As private house structures become more diverse with this trend, more and more users want to design their houses tailored to their needs. However, there is no proper means for a user to design their house on their own to have a structure that meets their needs, which makes communication between the designer and the user difficult in the design and construction of the house.

Meanwhile, Korean Patent Registration Publication No. 10-1105385 (registered on Feb. 5, 2012) proposes a system that allows a user to design a building on their own by combining and arranging standardized basic units of construction, which, however, is a system that only applies to wooden structures like traditional Korean houses (a.k.a Hanok). Moreover, there is no means of selecting options for the entrance to the inside of the house and the exit to the outside, and the user has no way of checking out the structure of a house of their own design. This will lead to low user satisfaction.

SUMMARY OF THE INVENTION

The present disclosure provides a Tetris house designing system that makes it easier for a layperson to design a house and enables simulation of a final house structure.

A Tetris house designing system according to an exemplary embodiment of the present disclosure comprises: a unit interior space providing part for providing unit interior spaces of a house as three-dimensional blocks, respectively, each reflecting an actual area of a certain size; a unit interior space selection part for selecting the types and number of the unit interior spaces; a house structure generation part for generating house structure data by combining three-dimensional blocks selected by the house unit interior space selection part; and a virtual reality data providing part for generating and providing virtual reality data on the basis of the house structure data.

Furthermore, the Tetris house designing system may further comprise a primary construction cost estimation part that estimates and presents an estimation of the primary construction cost, on the basis of the types and number of unit interior spaces selected by the unit interior space selection part and information on the actual areas of the three-dimensional blocks, when a final house structure is decided on the basis of the house structure data generated by the house structure generation part.

Furthermore, the house structure generation part may comprise: a first house structure generation part that generates first house structure data by combining the three-dimensional blocks selected by the unit interior space selection part in the form of a puzzle; and a second house structure generation part that generates second house structure data by setting the locations, types, and numbers of doorways, entrance ways, and windows on the basis of the first house structure data.

Furthermore, the first house structure generation part may comprise: a combination simulation part that provides at least one combination simulation for the three-dimensional blocks selected by the unit interior space selection part; and a combination interface part that is activated via user settings and provides a user interface to allow the user to combine the three-dimensional blocks selected by the unit interior space selection part.

Furthermore, the combination interface part may store information on designs involving impossible combinations of three-dimensional blocks, and, if the user creates a combination of three-dimensional blocks selected by the unit interior space selection part, corresponding to the above design information, may leave out the three-dimensional blocks from the combination simulation the user is working on.

Furthermore, the second house structure generation part may comprise: a block contact surface display part that displays contact surfaces of three-dimensional blocks included in the first house structure data so as to enable selection; a block outer surface display part that displays outer surfaces, except contact surfaces of three-dimensional blocks included in the first house structure data, so as to enable selection; an interior structure selection part that selects whether to have unit interior spaces open to each other through a contact surface displayed by the block contact surface display part and selects the type and location of a doorway; and an exterior structure selection part that selects the types and locations of windows and entranceways for an outer surface displayed by the block outer surface display part.

Furthermore, the virtual reality data providing part may comprise: a virtual reality data generation part that generates the virtual reality data by rendering the house structure data as three-dimensional model data; and a virtual reality data running part that runs the virtual reality data to allow the user to experience the interior structure, appearance, size, and lighting of a virtual house on the basis of the house structure data.

According to the present disclosure, it is possible to provide a Tetris house designing system that makes it easier for a layperson to design a house and enables simulation of a final house structure.

BRIEF DESCRIPTION OF THE DRAWINGS

FIG. 2 is a block diagram showing a detailed configuration of a house structure generation part according to an exemplary embodiment of the present disclosure.

FIGS. 5a and 5b are views showing three-dimensional blocks selected by a unit interior space selection part according to an exemplary embodiment of the present disclosure.

DESCRIPTION OF EXEMPLARY EMBODIMENTS

Figure 1:
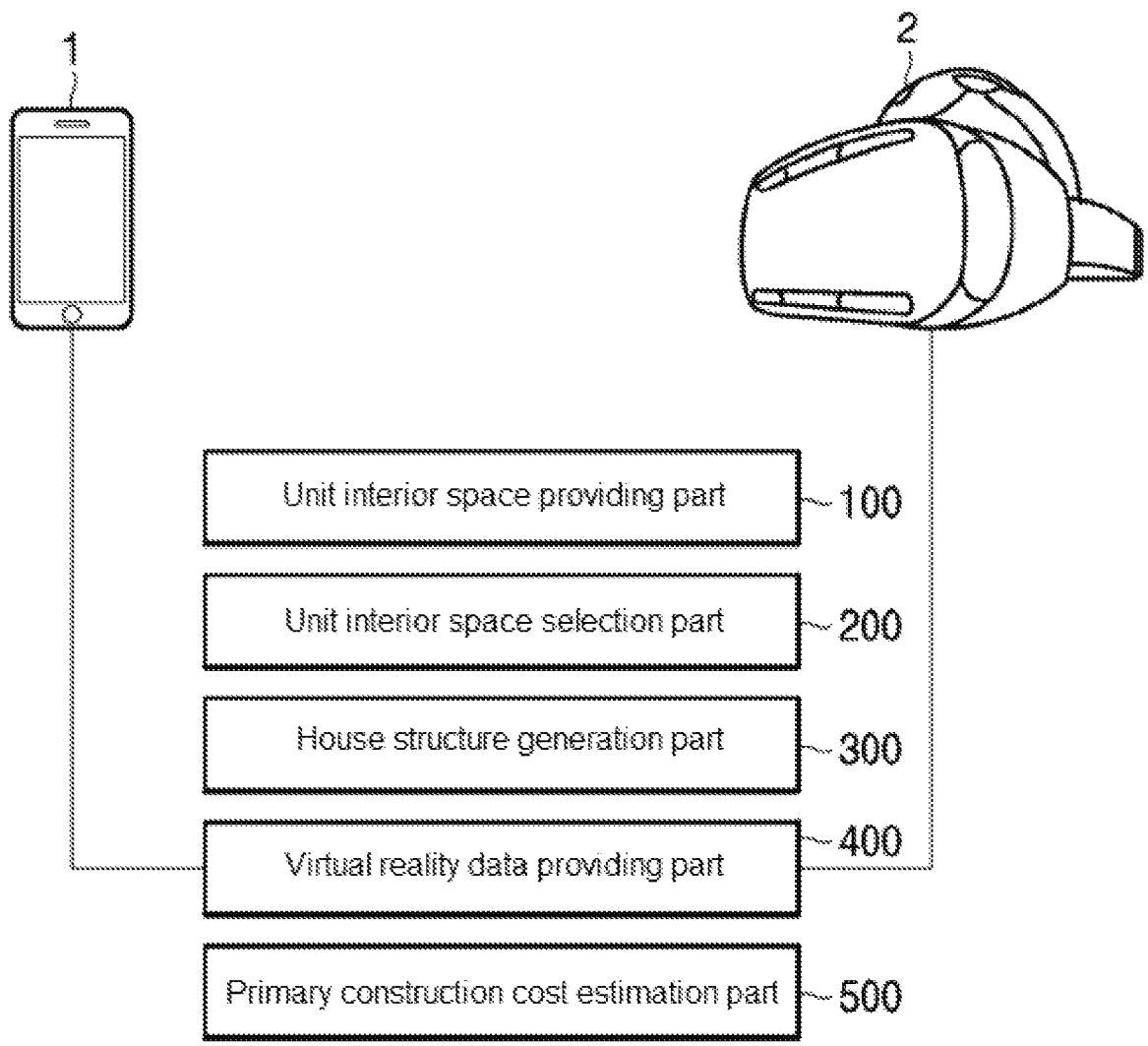
FIG. 1 is a block diagram and overview of an overall configuration of a Tetris house designing system according to an exemplary embodiment of the present disclosure.
Figure 3:
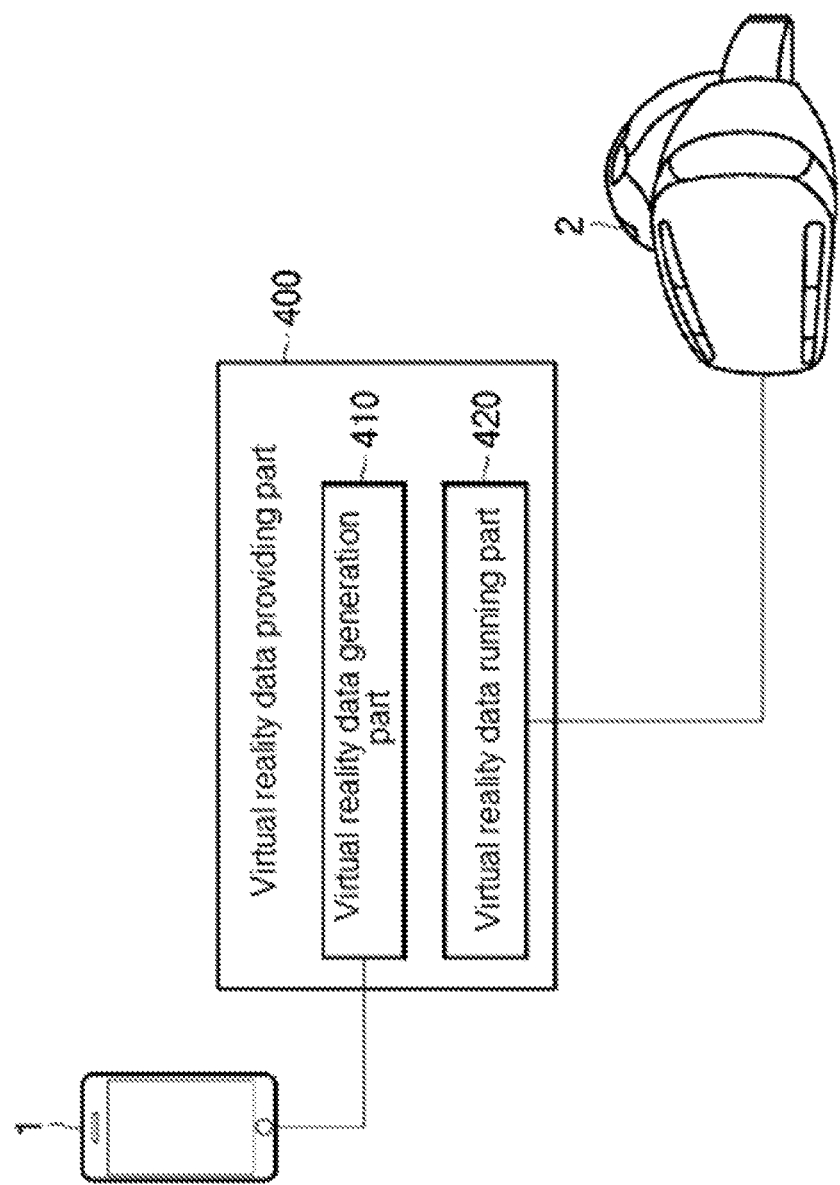
FIG. 3 is a block diagram showing a detailed configuration of a virtual reality data providing part according to an exemplary embodiment of the present disclosure.
Figure 4:
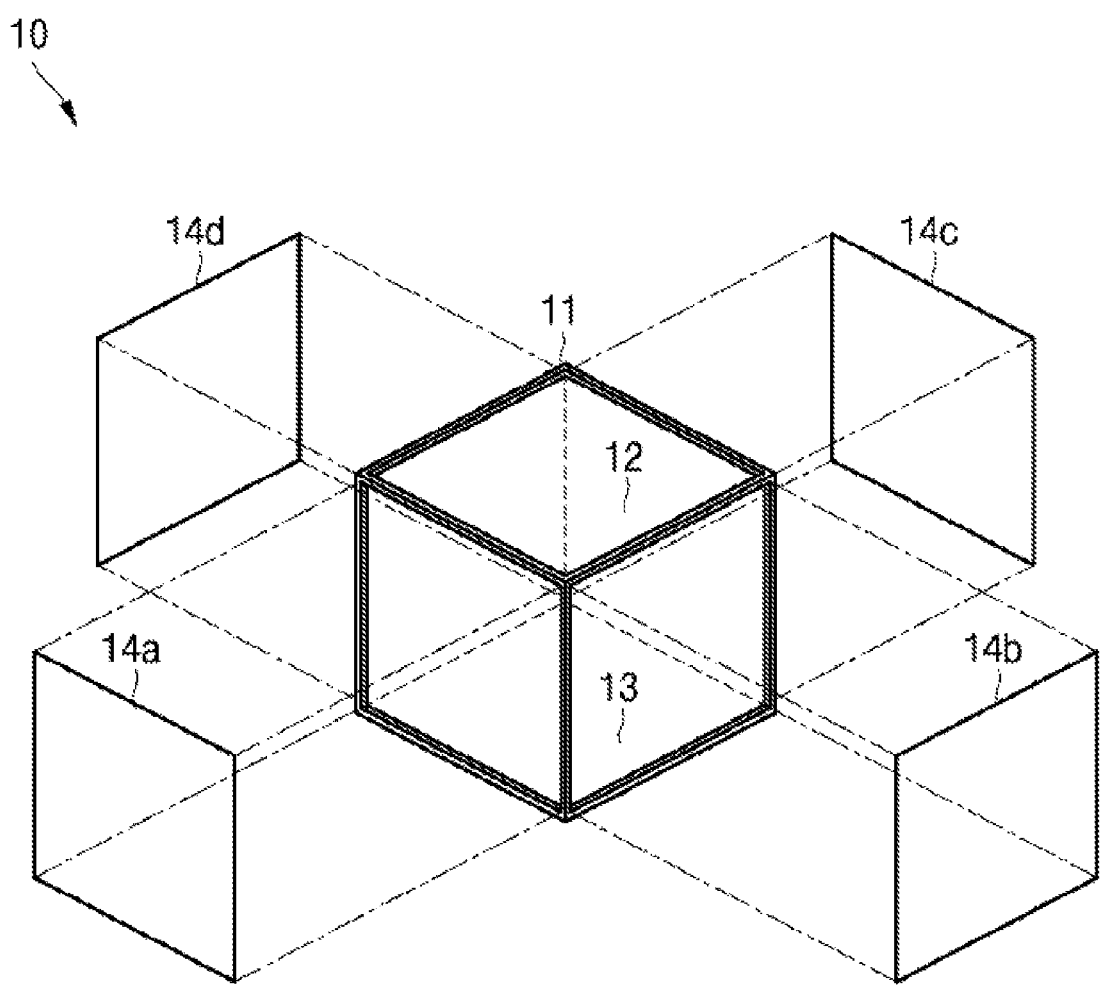
FIG. 4 is a view showing an image configuration of a three-dimensional block provided by a unit interior space providing part according to an exemplary embodiment of the present disclosure.
Figure 5B:
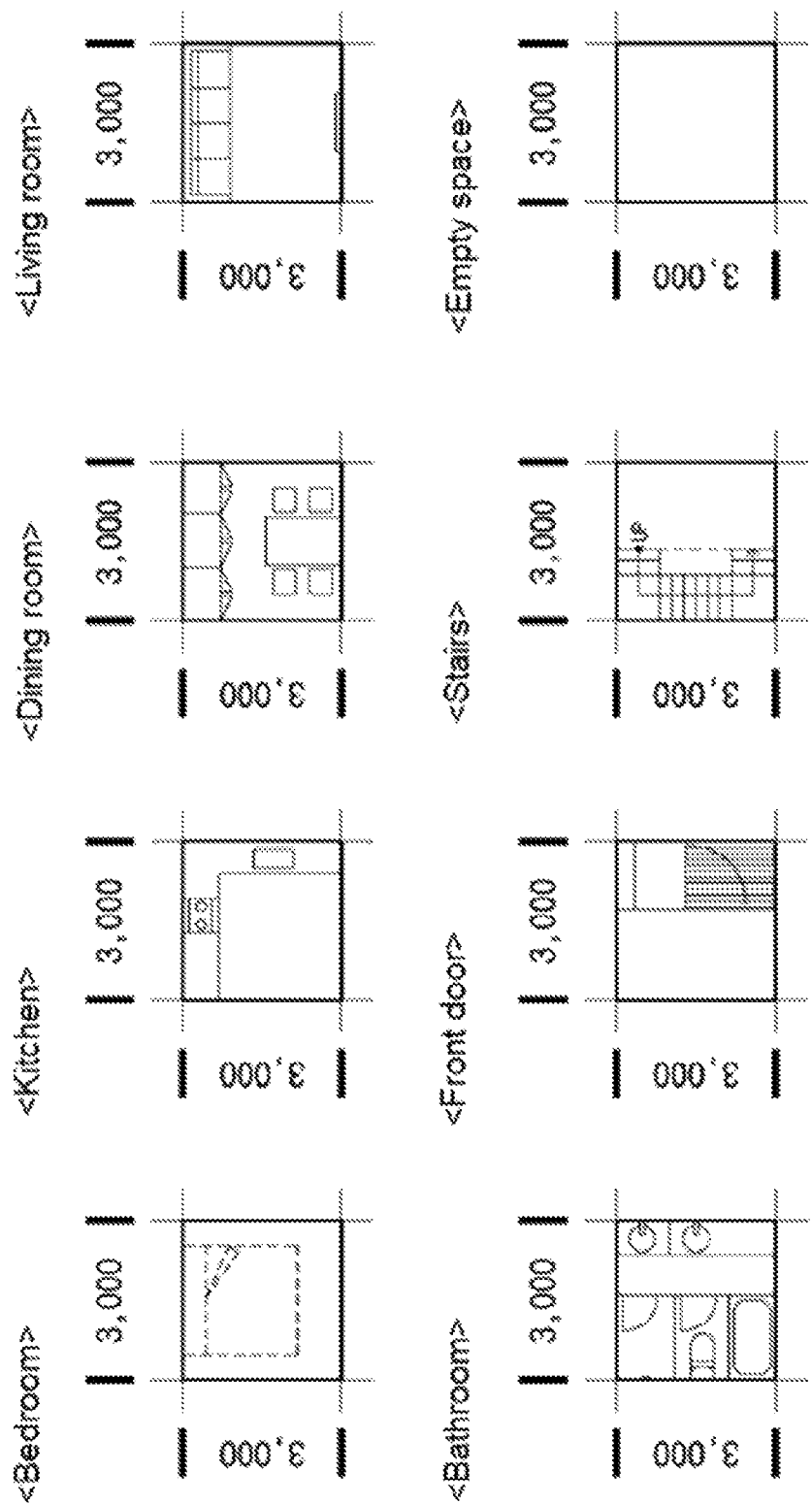
Figure 6A:
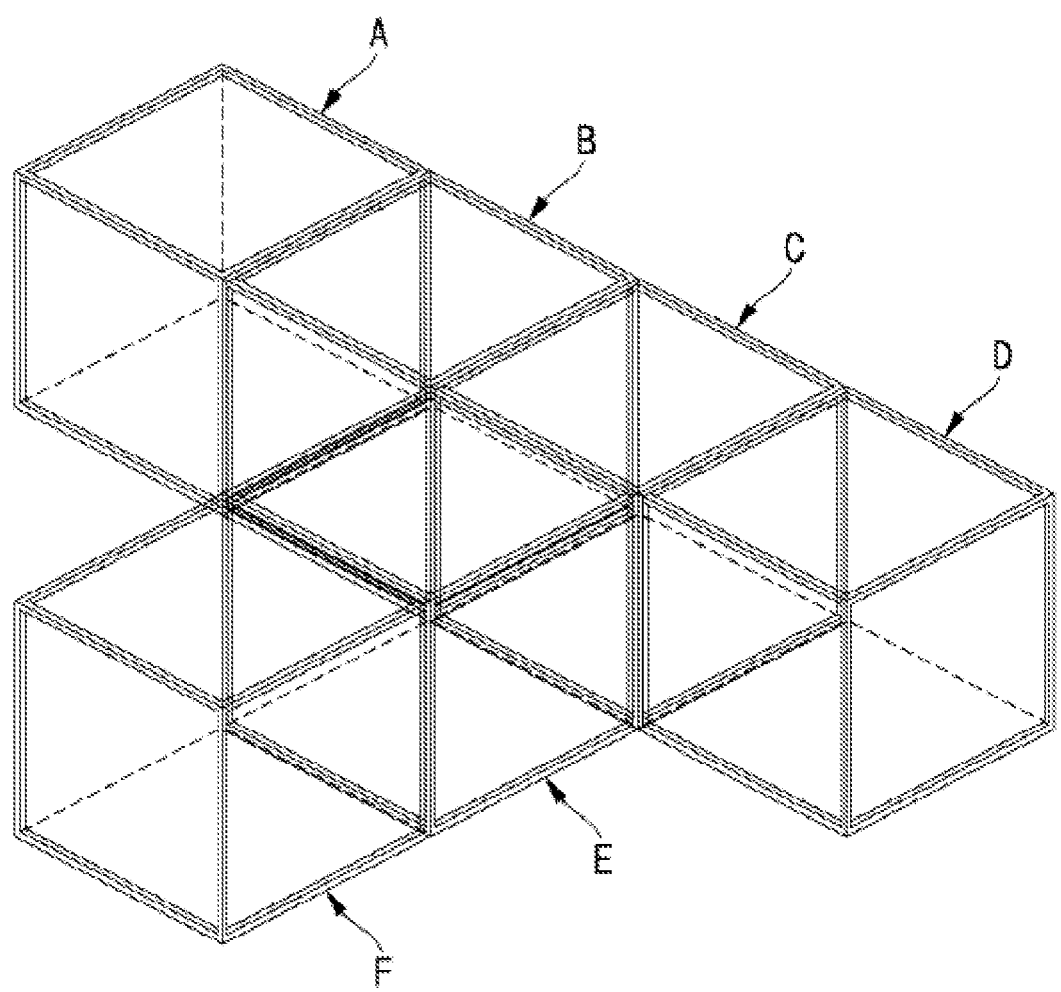
FIGS. 6a and 6b are views showing images of house structure data generated by a house structure generation part through a combination of blocks according to an exemplary embodiment of the present disclosure.
Figure 6B:
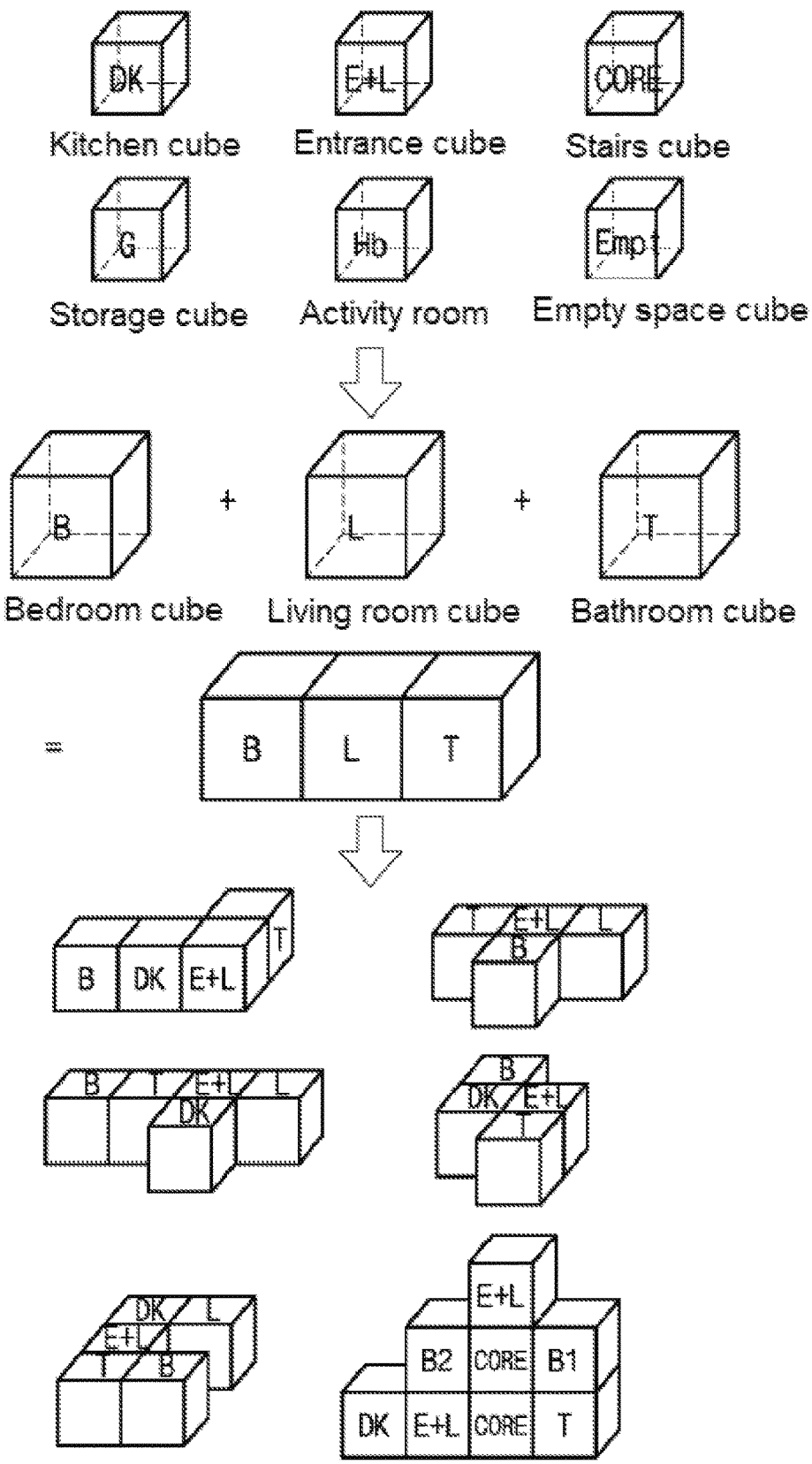
Figure 7:
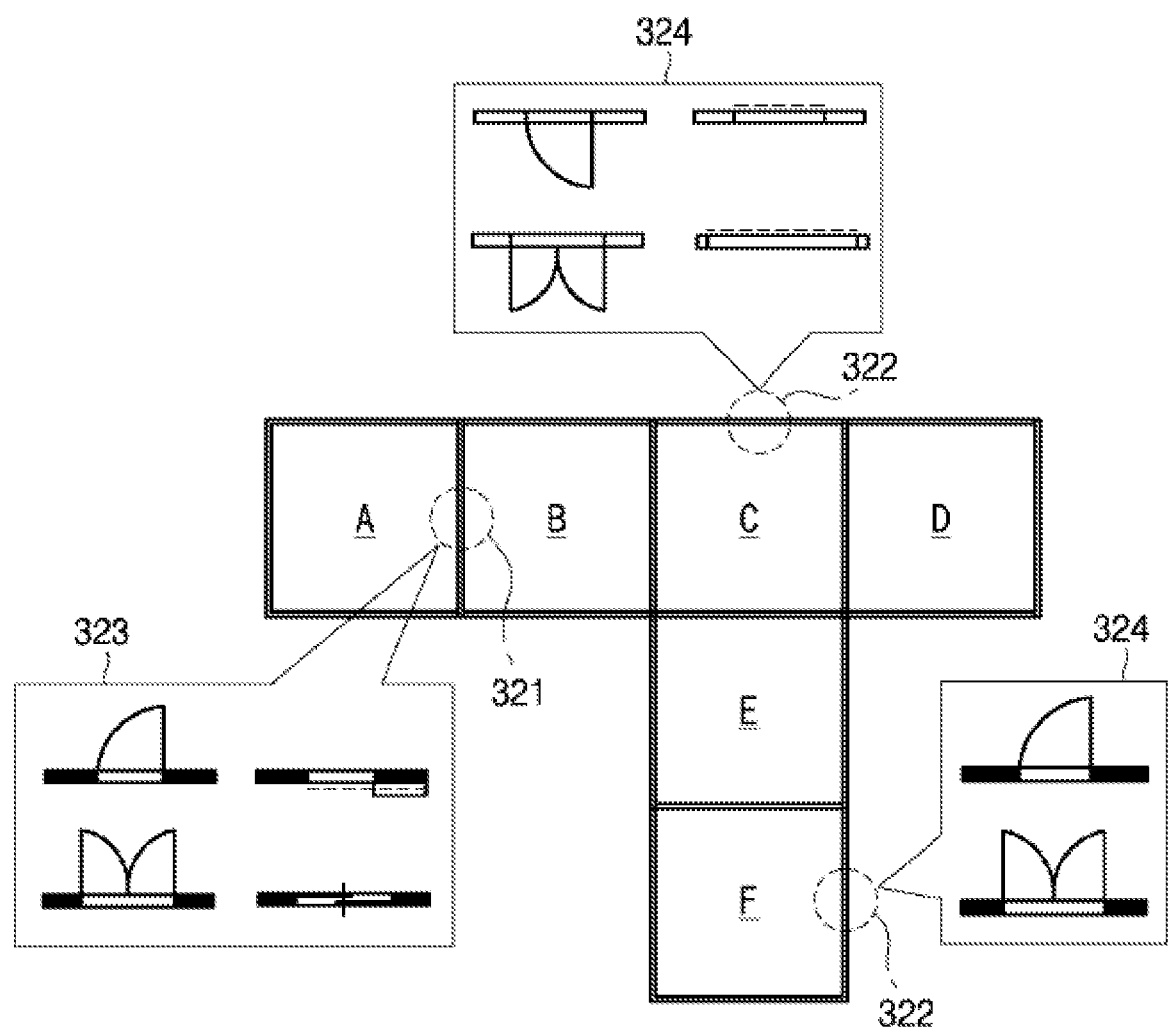
FIG. 7 is a view showing an interface for selecting an interior/exterior structure on the basis of generated house structure data according to an exemplary embodiment of the present disclosure.
Figure 8:
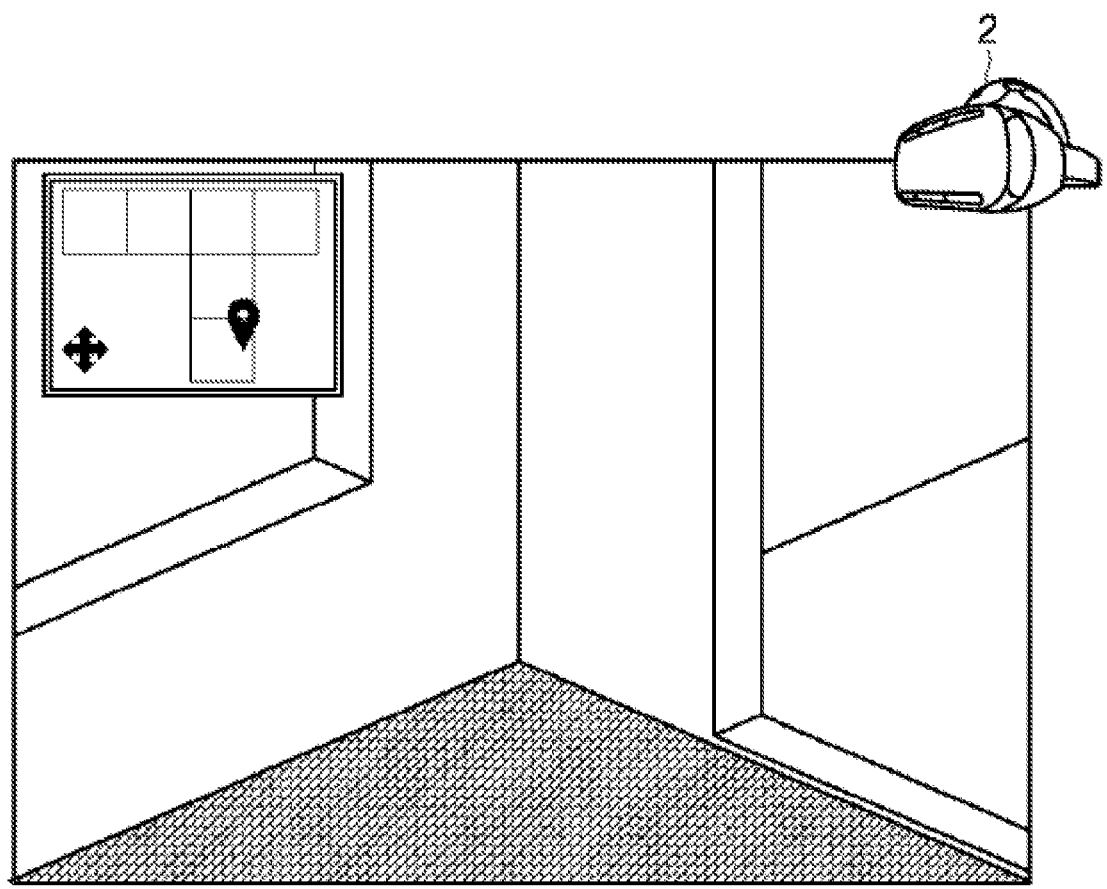
FIG. 8 is a view showing a virtual reality screen run by a virtual reality data providing part according to an exemplary embodiment of the present disclosure.

FIG. 1 is a block diagram and overview of an overall configuration of a Tetris house designing system according to an exemplary embodiment of the present disclosure. FIG. 2 is a block diagram showing a detailed configuration of a house structure generation part according to an exemplary embodiment of the present disclosure. FIG. 3 is a block diagram showing a detailed configuration of a virtual reality data providing part according to an exemplary embodiment of the present disclosure. FIG. 4 is a view showing an image configuration of a three-dimensional block provided by a unit interior space providing part according to an exemplary embodiment of the present disclosure. FIGS. 5a and 5b are views showing three-dimensional blocks selected by a unit interior space selection part according to an exemplary embodiment of the present disclosure. FIGS. 6a and 6b are views showing images of house structure data generated by a house structure generation part through a combination of blocks according to an exemplary embodiment of the present disclosure. FIG. 7 is a view showing an interface for selecting an interior/exterior structure on the basis of generated house structure data according to an exemplary embodiment of the present disclosure. FIG. 8 is a view showing a virtual reality screen run by a virtual reality data providing part according to an exemplary embodiment of the present disclosure.

Referring to FIGS. 1 through 8, a Tetris house designing system 1000 according to an exemplary embodiment of the present disclosure is a building design program using standardized, three-dimensional cuboid blocks, which comprises a unit interior space providing part 100, a unit interior space selection part 200, a house structure generation part 300, a virtual reality data providing part 400, and a primary construction cost estimation part 500.

In this exemplary embodiment, the unit interior space providing part 100, the unit interior space selection part 200, the house structure generation part 300, and the primary construction cost estimation part 500 may be implemented in the form of an application or program installed on a smart device 1 such as a smartphone or tablet PC. Although the virtual reality data providing part 400 may be implemented in the form of a program installed on a VR (virtual reality) device 2, this is merely an example of implementation, and it may be implemented in various forms.

Moreover, the application provides support to allow a user to design a house with a unique character on their own according to their taste, and, if necessary, the user may run the application by themselves with help from the designer or experts involved in the design. The VR device 2 may be omitted, and, in that case, relevant virtual reality data may be run through the application.

The unit interior space providing part 100 may provide unit interior spaces of a house as respective three-dimensional blocks 10, respectively, each reflecting an actual area of a certain size. As used herein, the term "unit interior space" means a space that functions as a living room, kitchen, dining room, bathroom, stairs, bedroom, front door, etc., which may be shown as a three-dimensional block 10 according to a given specification. For example, as shown in FIG. 4, each of the three-dimensional blocks 10 may be shown as an approximately cube-shaped, three-dimensional image consisting of a frame 11, a top 12, a bottom 13, and first to fourth sides 14a 14b, 14c, and 14d. The three-dimensional blocks 10 are preset to have a certain specification or size of around 3 m wide, 3 m long, and 3 m high.

Meanwhile, the three-dimensional blocks 10 may show a basic interior within the unit interior spaces to represent the unit interior spaces' individual functions—for example, three-dimensional graphics of a bedroom may be shown by default to represent a bed, a dressing table, a wardrobe, etc., and three-dimensional graphics of a kitchen may be shown to represent a sink, a refrigerator, etc. This helps intuitively identify the type of each individual block in the process of combining the three-dimensional blocks 10.

The unit interior space selection part 200 may select the types and number of the unit interior spaces. To this end, the unit interior space selection part 200 may comprise a user interface that provides icons or text information representing the types of the unit interior spaces and allows for selection of the number of unit interior spaces.

The unit interior space selection part 200 may display three-dimensional blocks selected by the user via the user interface. For example, as shown in FIG. 5a, if the user selects three-dimensional blocks A, B, C, D, E, and F, they may be displayed. Here, the block A may represent a bedroom, the block B may represent a dining room, the block C may represent a kitchen, the block D may represent a bathroom, the block E may represent a living room, and the block F may represent a front door, and, although not shown, the number of blocks selected by the user may be displayed too.

To design a building, a floor plan, a cross-section, and an elevation need to be drawn up, with actual lengths written on them, while imagining the shape of the building to be created in a three-dimensional space consisting of X, Y, and Z axes, which requires professional architectural practice. Architects can do this design work using a professional program such as SketchUp® or AutoCAD®, however this design process is not easy for laypeople. Nevertheless, a building can be created easily by choosing shapes and combining them according to options provided through the designing system 1000 of this exemplary embodiment.

That is, as shown in FIGS. 5b and 6b, if the user choses modules they need, such as a bedroom, a living room, a bathroom, a kitchen, a dining room, a front door, stairs, etc., as unit interior spaces to be displayed in three-dimensional blocks and combines them, the program will automatically make a number of different combinations to present a building. Thus, even laypeople can easily design buildings, and architectural errors can be minimized because the spaces are fixed in size.

The house structure generation part 300 may generate house structure data by combining three-dimensional blocks 10 selected by the unit interior space selection part 200. To this end, the house structure generation part 300 may comprise a first house structure generation part 310 and a second house structure generation part 320.

The first house structure generation part 310 may generate first house structure data by combining the three-dimensional blocks 10 selected by the unit interior space selection part 200 in the form of a puzzle. To this end, the first house structure generation part 310 may comprise a combination simulation part 311 and a combination interface part 312.

The combination simulation part 311 may provide at least one combination simulation for the three-dimensional blocks 10 selected by the unit interior space selection part 200. Basically, if all available unit interior spaces are selected, various possible house structures may be presented as images through combinations of all these three-dimensional blocks, i.e., the living room, kitchen, dining room, stairs, bedroom, front door, etc. Also, other possible house structures may be presented as images through combinations of other selected unit interior spaces, so that the user can see all possible house structures for each combination and select one they want.

Hence, if the user selects particular blocks 10, the combination simulation part 311 may simulate and display possible house structures created by combining the selected blocks 10, and have the user select a simulation they want.

The combination simulation part 311 may be useful for lay users who have limited knowledge of architectural structures, and may present advantages, interior suggestion information, etc. for each house structure.

The combination interface part 312 may be activated via user settings, and may provide a user interface to allow the user to combine on their own the three-dimensional blocks 10 selected by the unit interior space selection part 200.

For example, if the user selects the blocks A, B, C, D, E, and F as shown in FIG. 5a, data for a single house structure may be generated for the selected blocks A, B, C, D, E, and F by arranging the blocks A, B, C, and D in a row and placing the blocks E and F next to the block C as shown in FIG. 6a, and this data may be displayed in three-dimensional graphics. In this exemplary embodiment, the selected blocks may be combined into a T-shaped structure as described above, or the user may create various combinations on their own using the combination interface part 312 by moving graphics or icons representing the corresponding blocks around via drag-and-drop.

The combination interface part 312 stores information on designs involving impossible combinations of three-dimensional blocks. For example, information on a variety of combinations may be stored, including a combination where the first floor consists only of one block for and the second floor and above consist of a number of blocks, and a combination where the front door is located on the second floor, and a combination where the bathroom sits in between two bedrooms, that can bring expected inconveniences when using the house because the bedrooms are not open to each other.

If the user creates a block combination corresponding to the above design information, the combination interface part 312 may leave out the combined three-dimensional blocks from the combination simulation the user is working on.

For example, if the user creates a combination where the first floor consists only of one block for and the second floor and above consist of a number of blocks, some of the blocks on the second floor may be moved to the first floor, starting from the ones in a unit interior space which would be more appropriate if located on the first floor. In this process, inappropriately located blocks may be excluded or left out from the corresponding combination.

Moreover, if the user creates a combination where the front door is located on the second floor, the corresponding block may be left out from the combination and located on the first floor. In addition, if the user creates a combination where the bathroom sits in between two bedrooms, that can bring expected inconveniences when using the house because the bedrooms are not open to each other, the block corresponding to the 'bathroom' may be excluded or left out from the corresponding combination and located in an appropriate preset position. Accordingly, even users lack of knowledge about building design can be given guidance on designing appropriate block combinations.

Meanwhile, when three-dimensional blocks are connected together, the frames 11 included in the blocks also may be redundant. In that case, if two or more frames 11 overlap or be redundant, design data may be generated in such a way that they are automatically transformed into a single column on a design program.

The second house structure generation part 320 may generate second house structure data by setting the locations, types, and numbers of doorways, entrance ways, and windows on the basis of the generated first house structure data. To this end, the second house structure generation part 320 may comprise a block contact surface display part 321, a block outer surface display part 322, an interior structure selection part 323, and an exterior structure selection part 324. The block contact surface display part 321 and the block outer surface display part 322 may be run via one user interface (hereinafter, referred to as a first user interface), and the interior structure selection part 323 and the exterior structure selection part 324 may be run via another user interface (hereinafter, referred to as a second user interface).

The block contact surface display part 321 may display contact surfaces of three-dimensional blocks included in the first house structure data by using the first user interface so as to enable selection. For example, as shown in FIG. 7, if the block A and the block B are next to each other, the contact surface between the block A and the block B may be displayed so as to enable selection. Such a contact surface may be present between a bedroom and a living room, between a bedroom and a bathroom, between a bedroom and a kitchen, between a bedroom and a dining room, or the like. Thus, a contact surface between combined blocks may be recognized as a barrier or partition wall, and may be displayed so that the user can select what means of entrance they want to apply to the recognized barrier or partition wall or whether to open it or not. However, if adjacent blocks are the same type of unit interior spaces, any contact surface between these blocks may not be displayed depending on the settings. For example, for a combination where two living rooms, two bedrooms, or two bathrooms are directly connected together, they may be seen as an extended living room, extended bedroom, or extended bathroom, and any contact surface between the corresponding blocks may not be displayed for the user to select. This depends on the settings, and every contact surface between adjacent blocks may be displayed for the user to select even if the blocks are the same type.

The block outer surface display part 322 may display outer surfaces, except contact surfaces of three-dimensional blocks included in the first house structure data, by using the second user interface so as to enable selection. For example, as shown in FIG. 7, an outer surface of the block C that is not in contact with other blocks may be displayed so as to enable selection. Of course, every outer wall, as well as that of the block C, may be displayed so as to enable selection.

The interior structure selection part 323 may allow the user to select whether to have unit interior spaces open to each other through a contact surface displayed by the block contact surface display part 312 and select the type and location of a doorway, by using the first user interface. For example, as shown in FIG. 7, if the contact surface between the block A and the block B is selected, the entranceway between these blocks may be indicated by an architectural symbol for a door type, such as a single swing door, a double swing door, a single sliding door, a two-leaved sliding window, etc., or by its name or description, and the user may select the type of door they want and also the location of the door. Although not shown, the user may select to have the block A and the block B open to each other without an entranceway between them.

Meanwhile, the interior structure selection part 323 may provide the first user interface so that, for a combination of two blocks, the user can select the shape or type of redundant columns between the adjacent blocks, i.e., adjacent unit interior spaces, and select interior finishing materials.

The exterior structure selection part 324 may allow the user to select the types and locations of windows and entranceways for an outer surface displayed by the block outer surface display part 322 by using the second user interface. For example, as shown in FIG. 7, an architectural symbol for a window type or entranceway type, such as a single swing window, a double swing window, a wire window, a single sliding window, a double sliding window, etc., or its name or description may be shown, and the user may select the type of window or entranceway they want and also the location of the window or entranceway.

Meanwhile, the exterior structure selection part 324 may provide the second user interface so that the user can select exterior finishing materials, a roof's shape, and so on for a final combination of two blocks.

The aforementioned first and second user interfaces may be sequentially activated after the first house structure data is generated by the first house structure generation part 310, and the second house structure data may be generated once the types, locations, numbers, etc. of doorways, entranceways, and windows are set and selected via these interfaces.

Meanwhile, the house structure generation part 300 may provide a third user interface so that the user can set or select internal inter-block facilities such as electric wiring, drain lines, etc. between individual blocks combined by the user.

The virtual reality data providing part 400 may generate and provide virtual reality data on the basis of house structure data generated by the house structure generation part 300, i.e., second house structure data. To this end, the virtual reality data providing part 400 may comprise a virtual reality data generation part 410 and a virtual reality data running part 420.

The virtual reality data generation part 410 may generate the virtual reality data by rendering the house structure data as three-dimensional model data. It also serves to convert the house structure data generated by the house structure generation part 300 into three-dimensional graphic data or run it on the VR device 2. The virtual reality data generation part 410 may be implemented as a dedicated application installed on the smart device 1, and the generated virtual reality data may be transmitted to the VR device 2 so that the data can be run.

The virtual reality data running part 420 may be implemented in the form of a program installed on the VR device 2, or may be implemented as the VR device 2 itself. The virtual reality data running part 420 may run the virtual reality data to allow the user to experience the interior structure, appearance, size, and lighting of a virtual house on the basis of the house structure data generated by the virtual reality data generation part 410.

For example, as shown in FIG. 8, if the user wears the VR device 2, the virtual reality data generated by the virtual reality data generation part 410 may be run, and the virtual reality data running part 420 therefore allows the user to feel or experience the interior structure, appearance, size, etc. of the house while moving around within the virtual house. Through this process, the user can see how they are designing a house on their own as directly as possible. This allows the user to better understand the design structure of the house, rather than by seeing it on design drawings or the like, and gives help in modifying or altering the structural design of the house.

The primary construction cost estimation part 500 may estimate and present an estimation of the primary construction cost, on the basis of the types and number of unit interior spaces selected by the unit interior space selection part 200 and information on the actual areas of the three-dimensional blocks, when a final house structure is decided on the basis of the house structure data generated by the house structure generation part 300.

As described above, since three-dimensional blocks displayed as unit interior spaces have size information, the approximate cost of construction materials may be estimated on the basis of the total number of unit interior spaces selected by the user and the types of the unit interior spaces in the final house structure.

Once the final design of the house is decided through the above process, the designing system 1000 of this exemplary embodiment commissions a designated construction company to do the construction work. In this case, it may offer the amount of money left after subtracting construction licensing fees from the estimated construction cost, because fees differ depending on whether they are for reporting construction or for getting a construction license.

If a layperson creates a construction drawing using an existing computer design program, this means that they need to make the drawing while imagining a three-dimensional stereoscopic building in their mind by using a program such as SketchUp® or AutoCAD® which requires some professional practice. In that case, formulating a building structure or creating a design drawing can be quite difficult for people who are not trained in architectural practice. Moreover, design drawings created by laypeople cannot be put into practice in most cases, because people normally can't estimate an appropriate size for a space (for example, a lot of people usually tend to draw a bathroom or kitchen in a way that makes it look too narrow or wide).

The Tetris house designing system according to this exemplary embodiment allows even laypeople to plan and see a reasonable space by using standardized cuboids, easily create a shape for a building, and view and modify the configuration and interior and exterior spaces of the building with virtual reality (VR) goggles, makes construction easy by displaying estimated construction costs and construction drawings such as a floor plan, an elevation, a cross-section, a detail plan, etc., and increases user's access or convenience by implementing such a program using an app on a smartphone.

What is claimed is:

1. A system for designing a modular house, the system comprising:

a computer executing a program to perform the functions of:
a plurality of standardized, three-dimensional cuboid blocks for providing unit interior spaces of a house, respectively, each block reflecting an actual area of a certain size;
a unit interior space selection part implemented in the computer for selecting a type and number of the unit interior spaces;
a house structure generation part implemented in the computer for generating house structure data by combining three-dimensional blocks selected by a house unit interior space selection part; and
a virtual reality data providing part implemented in the computer for generating virtual reality data based on the house structure data,
wherein the house structure generation part comprises a combination interface configured to:
be activated via user settings,
provide a user interface to allow a user to combine the three-dimensional block selected by the unit inter space selection part, and
store information on designs involving impossible combinations of three-dimensional blocks; and
wherein, if the user creates a combination of three-dimensional blocks selected by the unit interior space selection part corresponding to the stored design information, the combination interface is further configured to leave out the three-dimensional blocks from the combination simulation the user is working on.

2. The system of claim 1, further comprising a primary construction cost estimation display that presents an estimation of the primary construction cost, based on the type and number of unit interior spaces selected by the unit interior space selection part and information on actual areas of the three-dimensional blocks, when a final house structure is decided based on the house structure data generated by the house structure generation part.

3. The system of claim 1, wherein the house structure generation part comprises:
a first house structure generation part implemented in the computer that generates first house structure data by combining the three-dimensional blocks selected by the unit interior space selection part in the form of a puzzle; and
a second house structure generation part implemented in the computer that generates second house structure data by setting locations, types, and numbers of doorways, entrance ways, and windows based on the first house structure data.

4. The system of claim 3, wherein the first house structure generation part generator comprises:
a combination simulation part implemented in the computer that provides at least one combination simulation for the three-dimensional blocks selected by the unit interior space selection part.

5. The system of claim 4, wherein the second house structure generation part generator comprises:
a block contact surface display displays contact surfaces of three-dimensional blocks included in the first house structure data so as to enable selection;
a block outer surface display that displays outer surfaces, except contact surfaces of three-dimensional blocks included in the first house structure data, so as to enable selection;
an interior structure selection part implemented in the computer that selects whether to have unit interior spaces open to each other through a contact surface displayed by the block contact surface display part and selects the type and location of a doorway; and
an exterior structure selection part implemented in the computer that selects the types and locations of windows and entranceways for an outer surface displayed by the block outer surface display.

6. The system of claim 1, wherein the virtual reality data providing part comprises: a virtual reality (VR) device to allow a user to experience an interior structure, appearance, size, and lighting of a virtual house based on the virtual reality data and the house structure data; and
wherein the virtual reality data is generated by rendering the house structure data as three-dimensional model data.

* * * * *